(12) United States Patent
Kalnitsky et al.

(10) Patent No.: US 7,026,666 B2
(45) Date of Patent: Apr. 11, 2006

(54) SELF-ALIGNED NPN TRANSISTOR WITH RAISED EXTRINSIC BASE

(75) Inventors: Alexander Kalnitsky, Portland, OR (US); Alexel Shatalov, Beaverton, OR (US); Michael Rowlandson, Portland, OR (US); Sang H. Park, Portland, OR (US); Robert F. Scheer, Portland, OR (US); Fanling H. Yang, Beaverton, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/734,928

(22) Filed: Dec. 12, 2003

(65) Prior Publication Data

US 2004/0126978 A1    Jul. 1, 2004

Related U.S. Application Data

(62) Division of application No. 10/119,594, filed on Apr. 9, 2002, now Pat. No. 6,767,798.

(51) Int. Cl.
*H01L 31/0328* (2006.01)
*H01L 31/0336* (2006.01)
*H01L 31/072* (2006.01)
*H01L 31/109* (2006.01)

(52) U.S. Cl. .................. 257/190; 257/197; 257/200
(58) Field of Classification Search .............. 257/190, 257/197, 200, 18
See application file for complete search history.

(56) References Cited

U.S. PATENT DOCUMENTS

| 4,157,269 A | 6/1979 | Ning et al. ................ 438/359 |
|---|---|---|
| 4,871,684 A | 10/1989 | Glang et al. ................ 438/322 |
| 4,879,255 A | 11/1989 | Deguchi et al. ............ 438/207 |
| 4,980,738 A | 12/1990 | Welch et al. ................ 206/437 |
| 5,061,652 A | 10/1991 | Bendernagel et al. ....... 438/104 |
| 5,117,271 A | 5/1992 | Comfort et al. ............ 257/198 |

(Continued)

OTHER PUBLICATIONS

Stanley Wolf Ph.D. and Richard N. Tauber Ph.D. in Silicon Processing for the VLSI Era, vol. 1: Process Technology, Lattice Press, 1986, pp. 399-400.*

(Continued)

*Primary Examiner*—William M. Brewster
(74) *Attorney, Agent, or Firm*—Blakely, Sokoloff, Taylor & Zafman LLP

(57) ABSTRACT

A self-aligned bipolar transistor and a method of formation thereof are provided. The bipolar transistor has a raised extrinsic base such that the link base resistance is reduced by providing an extrinsic base which is thicker than the intrinsic base. The increase in thickness of the extrinsic base provides a less resistive layer of the heavily doped base region. The method of forming the bipolar transistor includes depositing a first epitaxial layer on a substrate to form a base region having an intrinsic base region and an extrinsic base region. The extrinsic base region is raised by depositing a second epitaxial layer over a portion of the first epitaxial layer such that the thickness of the extrinsic base layer is x and the thickness of the intrinsic layer is y, wherein x>y. The second epitaxial layer is deposited using a chemical vapor epitaxial device where the concentration of Ge to Si is gradually reduced from above 5% to close to 0% during the epitaxy process. As such, the second epitaxy layer has the highest concentration of Ge near the interface of the first and second epitaxy layer. The concentration of Ge is gradually reduced to near 0% at the top surface of the second epitaxy region.

28 Claims, 11 Drawing Sheets

U.S. PATENT DOCUMENTS

| | | | |
|---|---|---|---|
| 5,159,429 A | 10/1992 | Bendernagel et al. | 257/210 |
| 5,244,821 A | 9/1993 | Ham et al. | 438/370 |
| 5,320,972 A | 6/1994 | Wylie | 438/366 |
| 5,340,753 A | 8/1994 | Bassous et al. | 438/366 |
| 5,516,708 A | 5/1996 | Li et al. | 438/368 |
| 5,516,710 A | 5/1996 | Boyd et al. | 437/309 |
| 5,587,327 A * | 12/1996 | Konig et al. | 438/312 |
| 5,599,723 A | 2/1997 | Sato | 438/308 |
| 5,773,350 A | 6/1998 | Herbert et al. | 438/364 |
| 5,804,486 A | 9/1998 | Zambrano et al. | 438/309 |
| 5,930,635 A | 7/1999 | Bashir et al. | 438/313 |
| 6,153,488 A | 11/2000 | Yoshino | 438/345 |
| 6,180,442 B1 | 1/2001 | Gris | 438/202 |
| 6,190,984 B1 | 2/2001 | Ryum et al. | 438/309 |
| 6,218,711 B1 | 4/2001 | Yu | 257/384 |
| 6,287,930 B1 | 9/2001 | Park | 438/369 |
| 6,376,322 B1 | 4/2002 | Gris | 438/301 |
| 6,492,237 B1 | 12/2002 | Kalnitsky et al. | 438/309 |
| 6,617,220 B1 * | 9/2003 | Dunn et al. | 438/309 |
| 2002/0132438 A1 | 9/2002 | Dunn et al. | 438/343 |
| 2003/0057458 A1 | 3/2003 | Freeman et al. | 257/273 |

OTHER PUBLICATIONS

Stanley Wolf, et al., Silicon Processing for the VLSI ERA, Lattice Press, Sunset Beach, CA pp. 191-194, 1986.

S.M. SZE, VLSI Technology, pp. 51-129 & 448-461, 1983, McGraw-Hill Book Company.

M. Racanelli, et al., Ultra High Speed SiGe NPN for Advanced BiCMOS Technology, Siliocon RF Platform Technologies, Conexant Systems, Inc. Newport Beach, CA.

* cited by examiner

SELF-ALIGNED NPN TRANSISTOR WITH RAISED EXTRINSIC BASE

CROSS-REFERENCE TO RELATED APPLICATION

This non-provisional United States patent application claims the benefit and is a divisional application of U.S. patent application Ser. No. 10/119,594 filed on Apr. 04, 2002 by inventors Alexander Kalnitsky et al., entitled "SELF-ALIGNED NPN TRANSISTOR WITH RAISED EXTRINSIC BASE", now U.S. Pat. No. 6,767,798, both of which are assigned to Maxim Integrated Products, Inc.

FIELD OF THE INVENTION

This invention relates generally to semiconductor processing, and in particular, to a method of forming a self-aligned bipolar transistor with a raised extrinsic base.

BACKGROUND OF THE INVENTION

Processes are known for fabrication of bipolar transistors having an extrinsic base region self-aligned to the sacrificial emitter structure. One example of such a process is described by M. Racanelli et al. in an article entitled "Ultra High Speed SiGe NPN for Advanced BiCMOS Technology", in the IEDM-2001 proceedings. Link base and extrinsic base implants are blocked from penetration in the intrinsic device area by the sacrificial emitter feature and the sacrificial emitter feature with a side wall spacer, respectively. Heavy p-type implants required to convert epitaxially deposited base material into a low resistivity extrinsic base region result in the generation of interstitial defects in the single crystal portion of the extrinsic base. The presence of interstitial defects promotes the transient enhanced diffusion of boron from the extrinsic base region into the intrinsic base during subsequent thermal processing. Interstitial defects also promote transient diffusion of the boron incorporated in the epitaxial base layer which leads to the effective base widening and the device speed reduction.

Another problem associated with the fabrication of higher speed bipolar transistors is the need to form thinner base films, which directly translates into a high base resistance. FIG. 1 illustrates a cross-sectional view of a typical npn bipolar transistor. The extrinsic link base region ($R_{bshl}$) comprises a thin Si, SiGe or SiGe:C epitaxial layer as used in the intrinsic base. Although heavily doped, this region will have higher resistance for thinner base films (faster transistors).

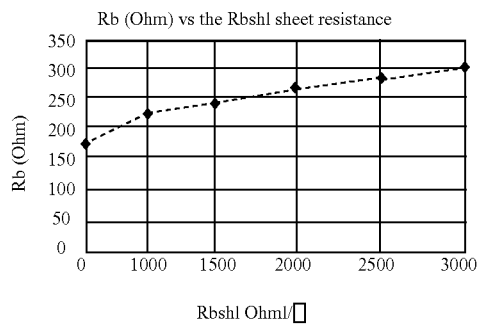

The graph shown above illustrates the calculated dependence of base resistance $R_b$ on the link base sheet resistance ($R_{bshl}$) for a given device geometry. A factor of three reduction in the link base resistance ($R_{bshl}$) will result in a significant (approximately 80 ohm) reduction in base resistance ($R_b$).

In view of the above, it is apparent that there is a need to provide a high speed bipolar transistor and a method of fabricating a high speed bipolar transistor which reduces or avoids the above mentioned problems.

SUMMARY OF THE INVENTION

In accordance with the invention, a new and improved bipolar transistor and a method of forming same is provided. The bipolar transistor has a raised extrinsic base such that the link base resistance is reduced by providing an extrinsic base which is thicker than the intrinsic base. The increase in thickness of the extrinsic base provides a less resistive layer of the heavily doped link base region.

The method of forming the bipolar transistor includes depositing a first epitaxial layer on a substrate to form a base region having an intrinsic base region and an extrinsic base region. The extrinsic base region is raised by depositing a second epitaxial layer over a portion of the first epitaxial layer such that the thickness of the extrinsic base layer is x and the thickness of the intrinsic layer is y, wherein x>y.

The second epitaxial layer is deposited using a chemical vapor epitaxial device where heavily p-type (e.g. boron) doped silicon is deposited selectively on exposed silicon surfaces. In order to improve process selectivity, a heavily p-type doped SiGe may be optionally deposited, where the concentration of Ge to Si is gradually reduced from above 5% to close to 0% during the epitaxy process. As such, the second epitaxy layer has the highest concentration of Ge near the interface of the first epitaxy layer and the second epitaxy layer. The concentration of Ge is gradually reduced to near 0% at the top surface of the second epitaxy region.

Other aspects, features and techniques of the invention will become apparent to one skilled in the relevant art in view of the following detailed description of the invention.

DETAILED DESCRIPTION OF THE INVENTION

Figure 1:
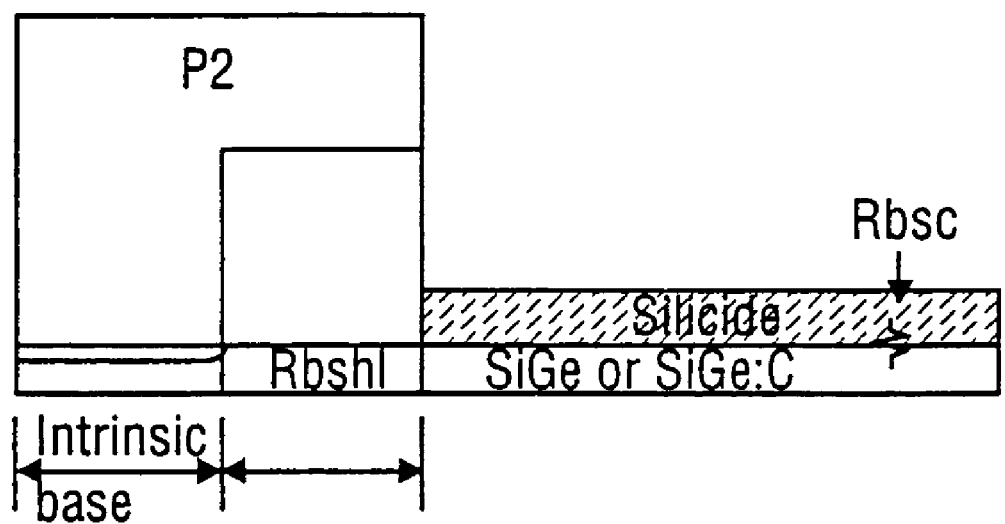
FIG. 1 illustrates a partial cross-sectional view of a typical prior art npn bipolar transistor
Figure 2:
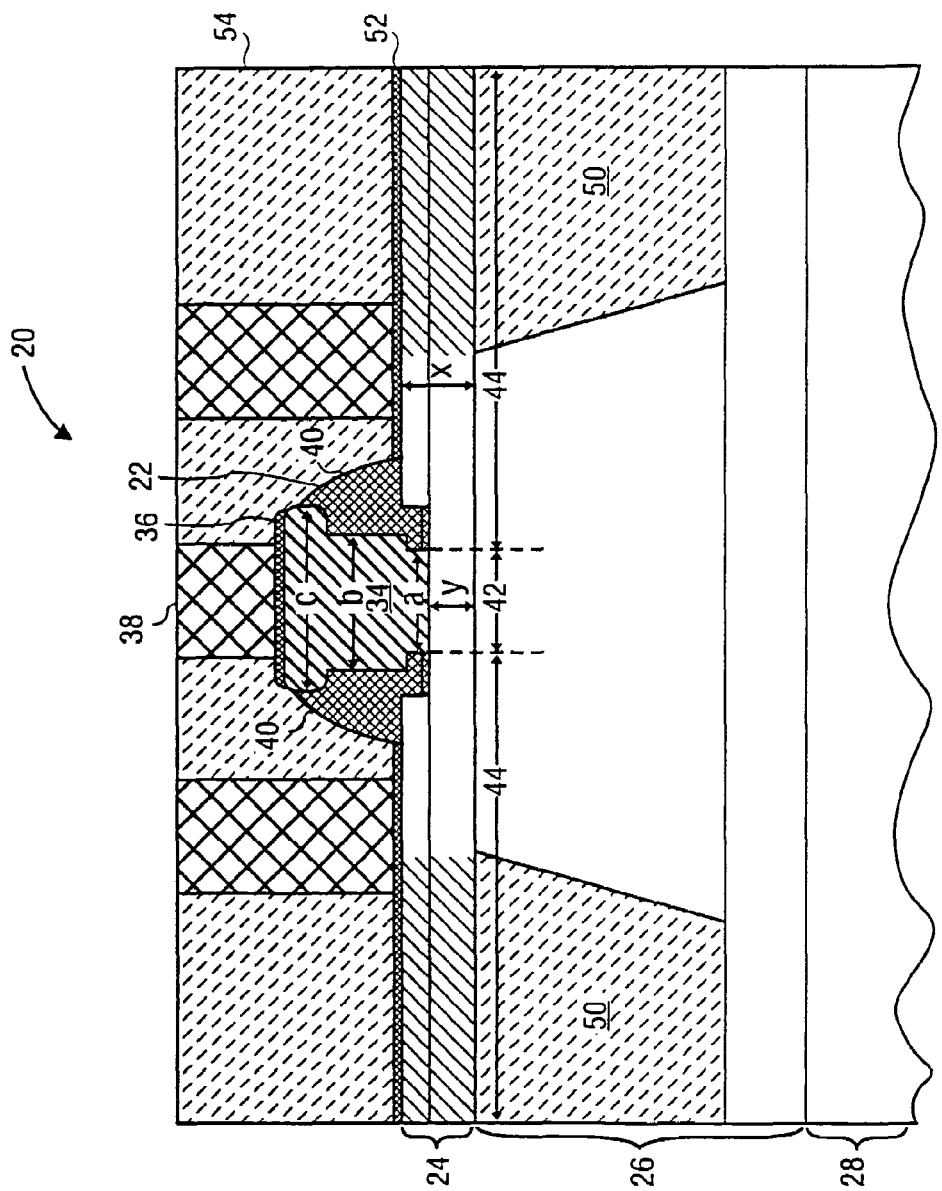
FIG. 2 illustrates a partial cross-sectional view of a npn bipolar transistor in accordance with the invention.

FIG. 2 illustrates a cross-sectional view of a npn bipolar transistor 20 in accordance with the invention. The bipolar transistor 20 has a n-type emitter region 22, a p-type base region 24, and an n-type collector region 26. The bipolar transistor 20 comprises a p-type substrate 28 and a p-type Si, SiGe or SiGe:C epitaxial layer. It shall be understood that the substrate, emitter region, base region, and collector region may be doped with the opposite conductivity, i.e. the substrate may be n-type, the emitter may be p-type, the base region may be n-type, and the collector region may p-type.

The emitter region 22 comprises a polysilicon emitter 34 having a first portion with a width a, a second portion with a width b, and a third portion with a width c wherein c>b>a. The first portion defines an emitter base junction having the width a, and the third portion defines the emitter contact region having the width c. A surface of the emitter contact region includes a refractory metal silicide layer 36 such as $CoSi_2$ or $TiSi_2$ to reduce contact resistance with an emitter contact 38. Emitter spacers 40 directly abut the walls of the polysilicon emitter 34. In the exemplary embodiment, the emitter spacers 40 are formed from a dielectric such as silicon dioxide or silicon nitride.

The base region 24 has an intrinsic base region 42 and an extrinsic base region 44. As can be seen in FIG. 2, the extrinsic base region 44 is raised relative to the intrinsic base region 42. The base region 24 may be further defined as comprising a mono crystalline portion and a poly crystalline portion. The mono crystalline portion is directly over the mono crystalline portion of the substrate 28 and the poly crystalline portion is supported by an oxide layer 50. A surface of the extrinsic base region 44 is raised relative to the surface of the intrinsic base region 42 outside of the intrinsic base region 42. The extrinsic base region 44 has a thickness x and the intrinsic base region has a thickness y, wherein x>y. The base regions 24 further includes a refractory metal silicide layer 52 such as $CoSi_2$ or $TiSi_2$ to reduce contact resistance with base contacts. The surface of the bipolar transistor is coated with an interlayer insulating film 54 such as silicon dioxide.

Figure 3A:
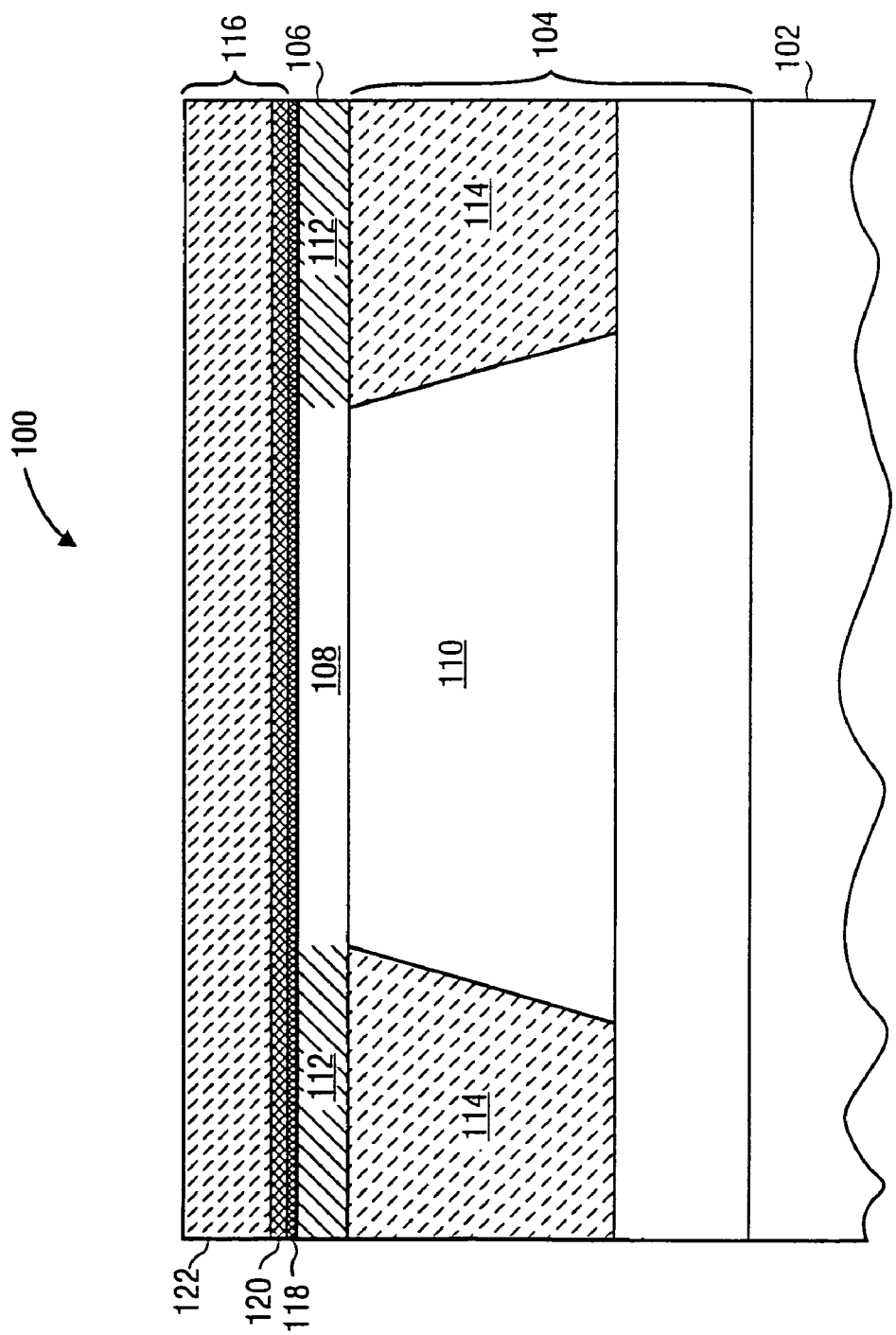
FIG. 3A illustrates a cross-sectional view of an exemplary semiconductor device shown at a step of an exemplary method of forming a npn bipolar transistor in accordance with the invention.

FIG. 3A illustrates a cross-sectional view of an exemplary semiconductor device 100 at a step of an exemplary method of forming a bipolar transistor in accordance with the invention. At this step, the semiconductor device 100 comprises a p-type Si substrate 102 having a n-type collector region 104 and a p-type Si, SiGe or SiGe:C epitaxial layer 106. The epitaxial layer 106 is deposited over the surface of the substrate 102 such that a mono crystalline portion 108 of the epitaxial layer 106 is deposited over the mono crystalline portion 110 of the substrate 102 and a poly crystalline portion 112 of the epitaxial layer 106 is deposited over an oxide layer 114 of the substrate 102. It is noted that the epitaxial layer 106 may comprise multiple layers such as a lower p-type layer doped with boron and a thin n-type layer doped with arsenic.

An ONO (oxide-nitride-oxide) stack 116 is formed on the substrate 102, wherein the thickness of the ONO (oxide-nitride-oxide) stack determines the final height of the polysilicon emitter. The ONO (oxide-nitride-oxide) stack 116 comprises a thin silicon dioxide layer 118, a silicon nitride layer 120, and a top silicon dioxide layer 122. The thin silicon dioxide layer 118 is thermally grown over the epitaxial layer 106 to a sufficient thickness to serve as an etch stop for silicon nitride reactive ion etch. The silicon nitride layer 120 may be deposited by low-pressure-chemical-vapor-deposition (LPCVD) or other processes known to one skilled in the art to a thickness ranging from about 50 to 500 Angstroms, and the top silicon dioxide layer 122 may be deposited by PECVD to a thickness ranging from about 1,000 to 10,000 Angstroms.

Figure 3B:
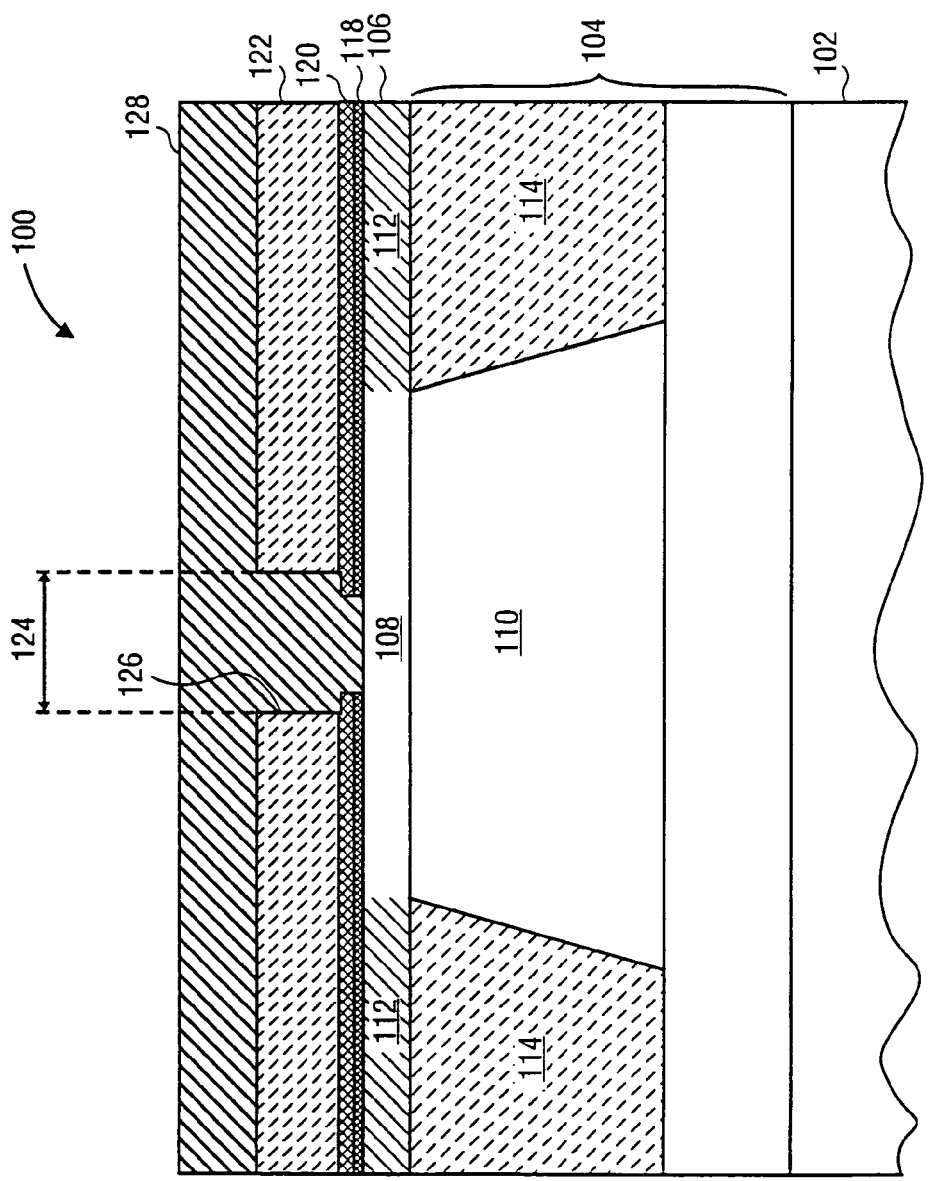
FIG. 3B illustrates a cross-sectional view of the exemplary semiconductor device shown at a subsequent step of the exemplary method of forming the npn bipolar transistor in accordance with the invention.

FIG. 3B illustrates a cross-sectional view of the exemplary semiconductor device 100 at a subsequent step of the exemplary method of forming a bipolar transistor in accordance with the invention. At this subsequent step, an emitter mask layer is formed over the top silicon dioxide layer 122. The emitter mask layer may be formed of photo resist material or other materials that can serve as a mask for a subsequent process of selectively etching the top silicon dioxide layer 122 and the underlying silicon nitride layer 120 to form an emitter window 124. The thin silicon dioxide layer 118 is left in place to protect the surface of a base region from contamination and to improve implant uniformity. A self-aligned collector implant is then performed by ion implanting an n-type dopant such as arsenic or phosphorous through the emitter window 124 using implant energies ranging from 80 keV to 200 keV at a dose ranging from 1E12 to 5E13 $cm^{-2}$. The n-type ions pass through the base region to form a narrow medium doped region just below the base region and self aligned to the emitter window 124. After performing the ion implant, the thin oxide layer 118 is wet etched at the emitter window 124 by a HF dip. During the wet etching, side walls 126 of the top silicon dioxide layer 122 are also etched and pulled back. A layer of polysilicon 128 is deposited onto the substrate 102. In the exemplary method, the polysilicon layer 128 may be in situ doped with n-type dopant while deposited by low-pressure-chemical-vapor-deposition (LPCVD), epitaxial silicon reaction, or other processes known in the art.

Figure 3C:
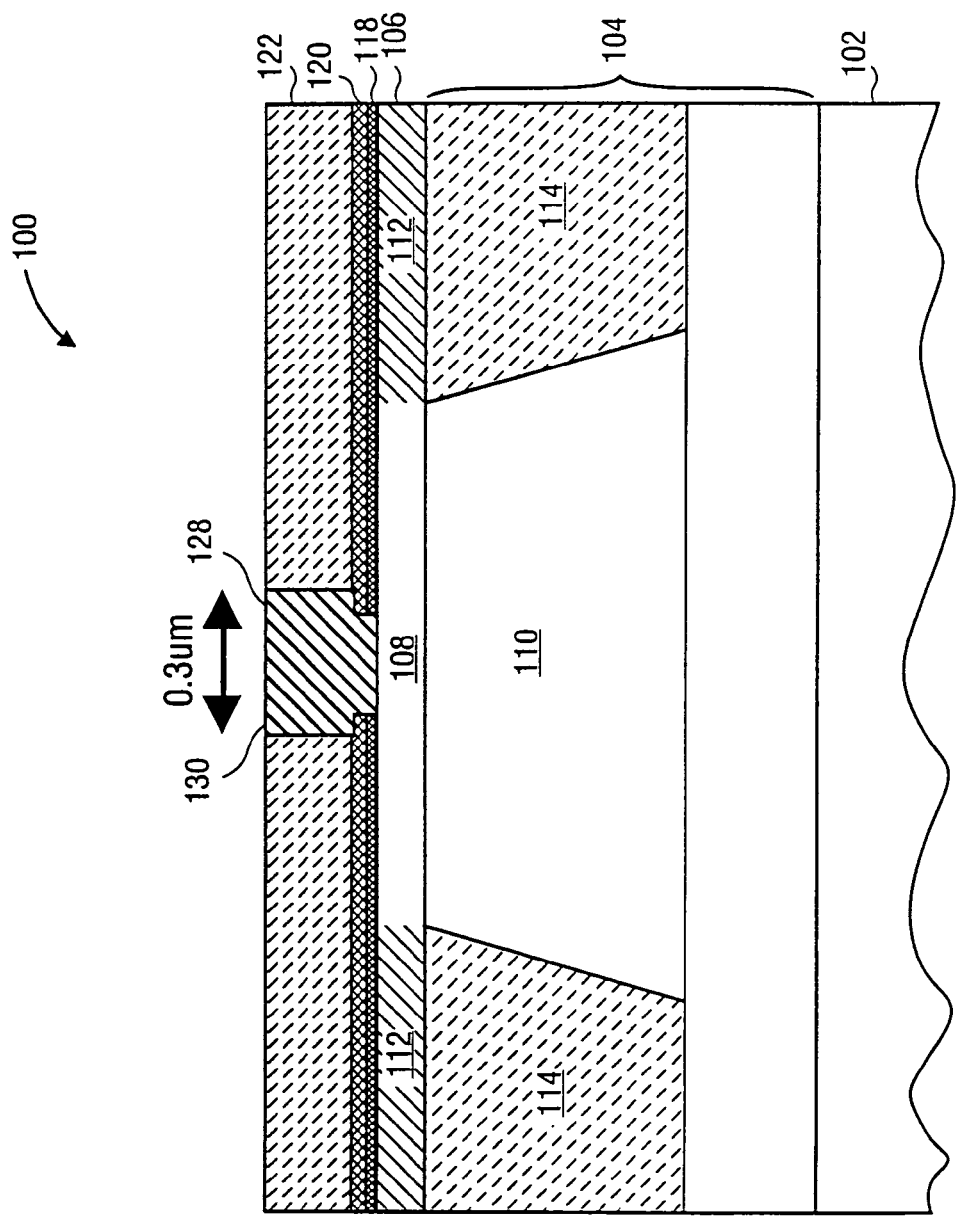
FIG. 3C illustrates a cross-sectional view of the exemplary semiconductor device shown at another subsequent step of the exemplary method of forming the npn bipolar transistor in accordance with the invention.

FIG. 3C illustrates a cross-sectional view of the exemplary semiconductor device 100 at another subsequent step of the exemplary method of forming a bipolar transistor in accordance with the invention. In this subsequent step, a polysilicon emitter 130 is formed by etching back the polysilicon layer 128, wherein the top surface of the polysilicon layer 128 is coplanar to the top surface of the top silicon dioxide layer 122 after the etch back is completed. In the exemplary method, the polysilicon layer 128 is isotropically etched back by reactive plasma ion etching. As an alternative, the polysilicon layer 128 may be etched back by a combined process which includes chemical mechanical polishing (CMP) and etch back.

Figure 3D:
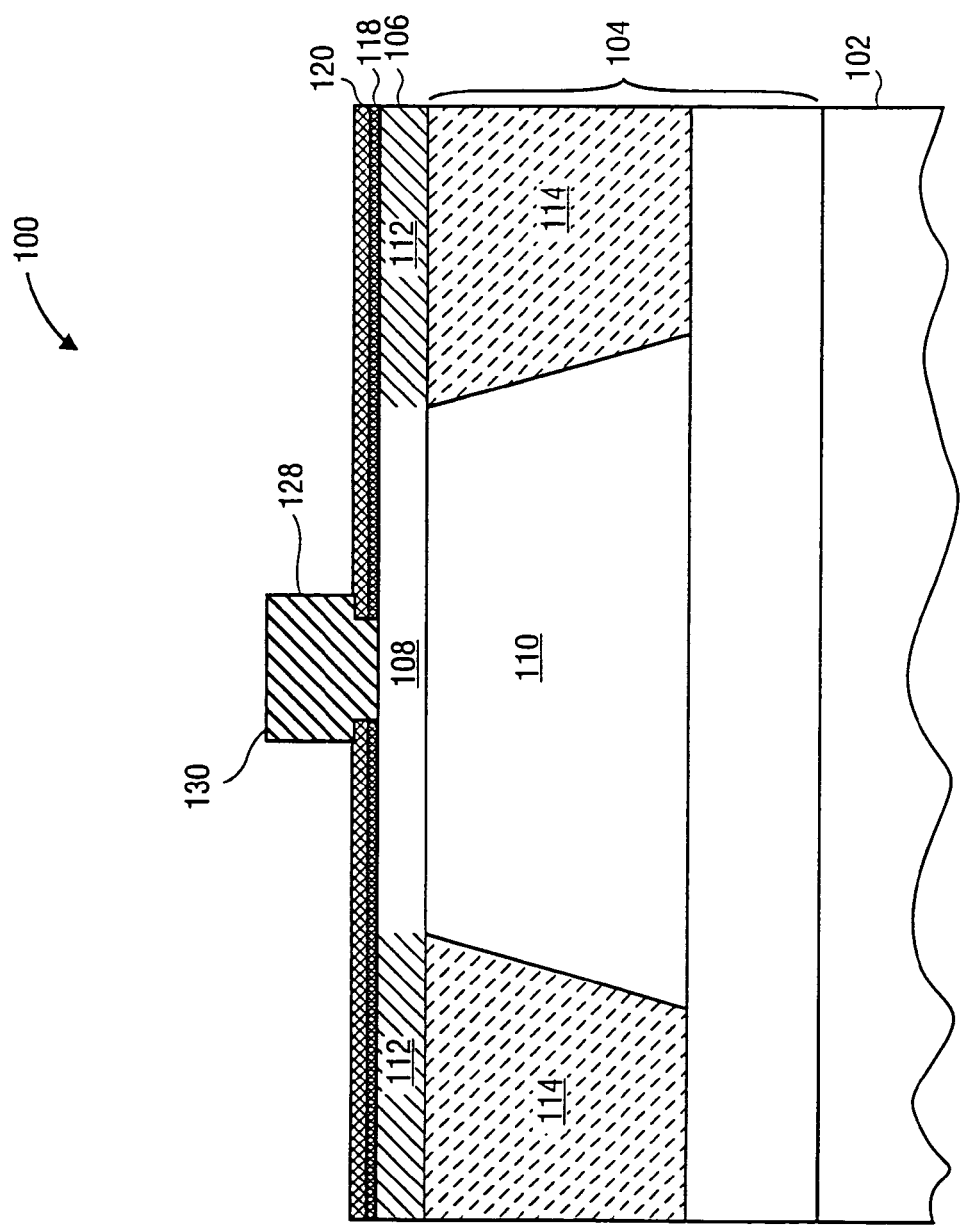
FIG. 3D illustrates a cross-sectional view of the exemplary semiconductor device shown at another subsequent step of the exemplary method of forming the npn bipolar transistor in accordance with the invention.

FIG. 3D illustrates a cross-sectional view of the exemplary semiconductor device 100 at another subsequent step of the exemplary method of forming a bipolar transistor in accordance with the invention. In this subsequent step, the polysilicon emitter 130 is exposed by selectively removing the top silicon dioxide layer 122. In the exemplary method, the sidewalls of the polysilicon layer 128 are exposed as a result of the oxide wet etch.

Figure 3E:
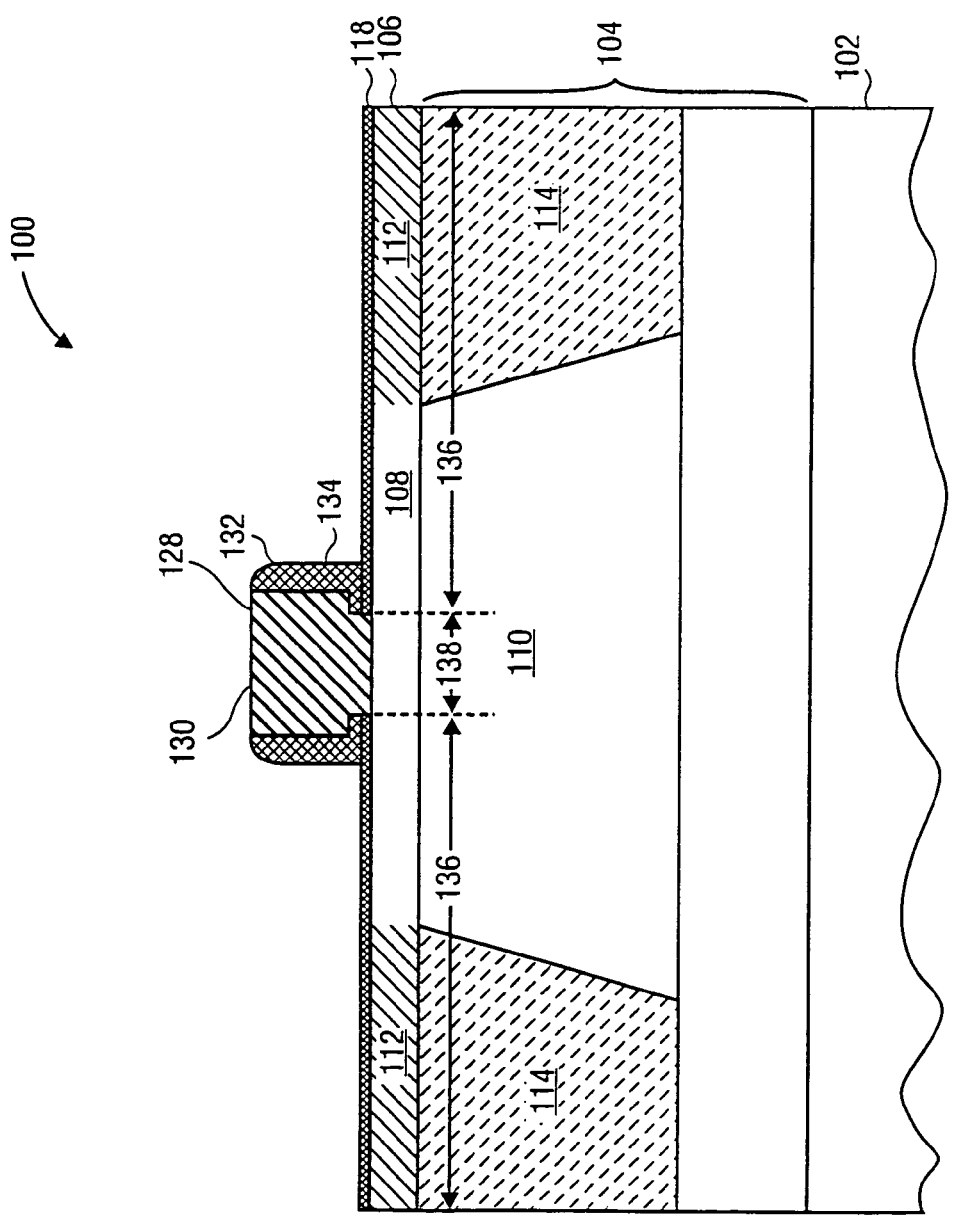
FIG. 3E illustrates a cross-sectional view of the exemplary semiconductor device shown at a subsequent step of the exemplary method of forming the npn bipolar transistor in accordance with the invention.

FIG. 3E illustrates a cross-sectional view of the exemplary semiconductor device 100 at another subsequent step of the exemplary method of forming a bipolar transistor in accordance with the invention. In this subsequent step, a thin nitride spacer 132 adjacent to the polysilicon emitter 130 is formed by depositing a layer of silicon nitride 134 having a thickness in the range of 0.01 microns to 0.1 microns and anisotropically etching the layers of silicon nitride 134. In the exemplary method, the silicon nitride layers 120, 134 are directionally etched with a plasma etcher.

Figure 3F:
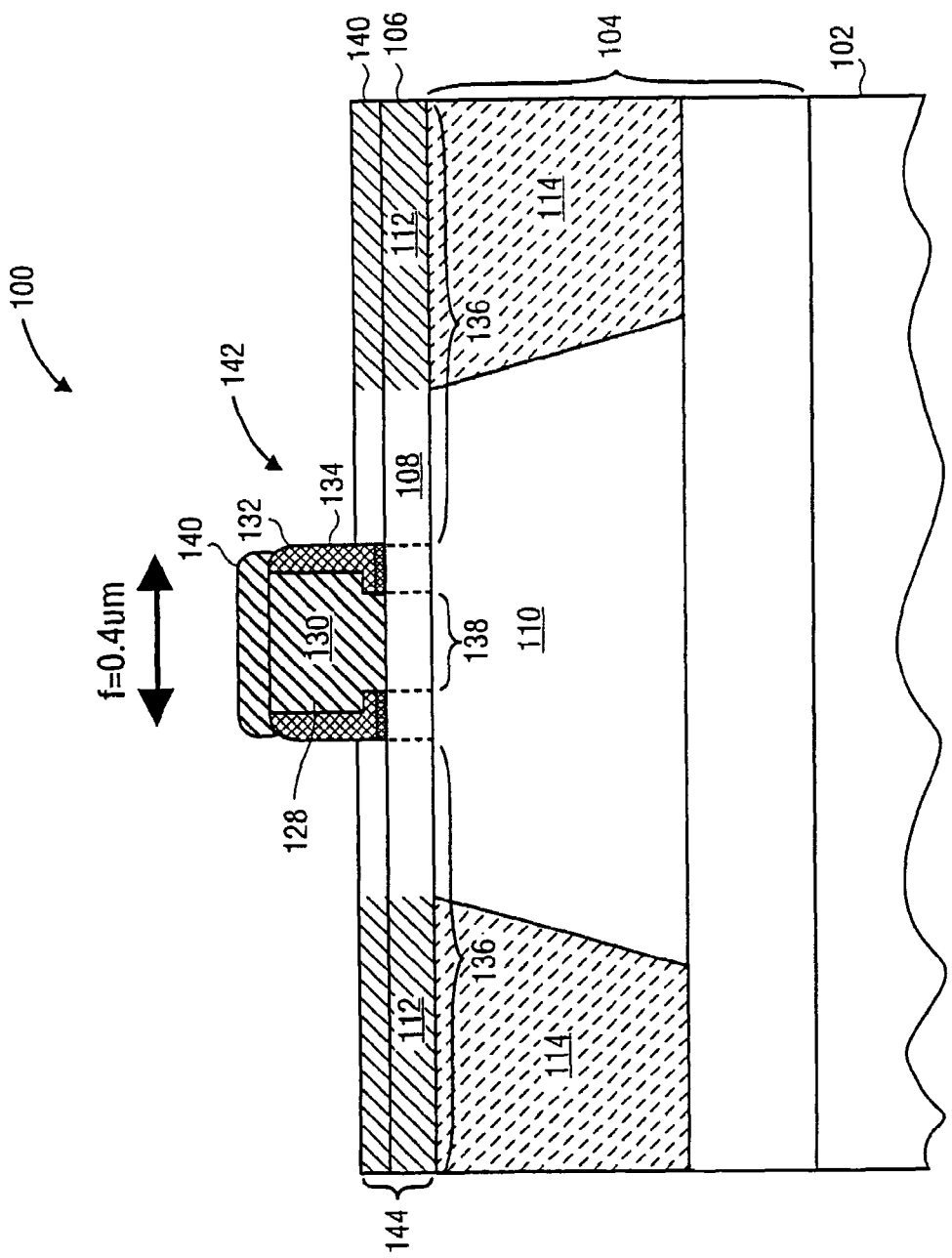
FIG. 3F illustrates a cross-sectional view of the exemplary semiconductor device shown at a subsequent step of the exemplary method of forming the npn bipolar transistor in accordance with the invention.

FIG. 3F illustrates a cross-sectional view of the exemplary semiconductor device 100 at another subsequent step of the exemplary method of forming a bipolar transistor in accordance With the invention. In this subsequent step, the extrinsic base region 136 is raised. The thin silicon dioxide layer 118 is wet etched with HF, and a heavily p-type doped epitaxial layer 140 is selectively deposited at a relatively low temperature over the base epitaxial layer 106 and over the polysilicon emitter 130 (the polysilicon emitter 130 can optionally be protected by a layer of low temperature thermal oxide). In the exemplary method, the epitaxial layer 140 is deposited in a chemical vapor epitaxy device wherein heating elements raise a susceptor to a temperature between 650 to 750° C. Gases such as silane ($SiH_4$), a boron-containing gas and, optionally, germane ($GeH_4$) are introduced into a process chamber. Germane is typically introduced to improve the selectivity of the deposition on silicon relative to nitride. Percentage of germane is gradually reduced to near zero percent (between 0.5 percent and 0 percent) such that the percentage by mole fraction of germane gas to silane gas decreases from about 5 to 10 percent near the beginning of the expitaxy process to less than 1 percent near the end of the epitaxy process.

Once the SiGe seed is formed, the germane concentration may be reduced while still providing epitaxy without increasing the temperature in the reactor. The reduction of the germane concentration causes the Ge concentration to diminish near the surface of the raised extrinsic base 136. As a result, it is easier to form silicides on the top portion of the raised extrinsic base 136. As an option, a self-aligned silicide formation of the extrinsic base region 136 and emitter region 142 may be performed (not shown).

Figure 3G:
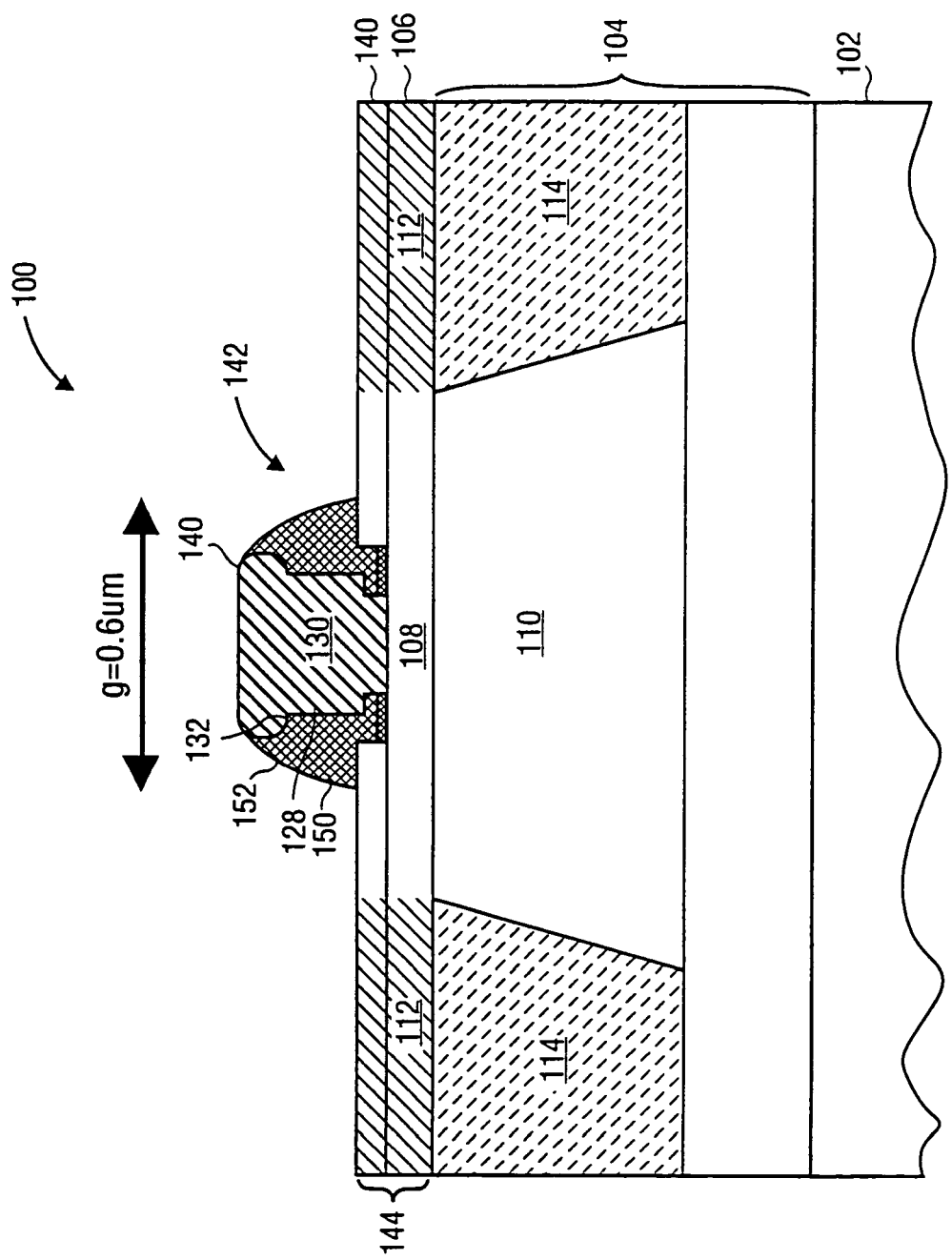
FIG. 3G illustrates a cross-sectional view of the exemplary semiconductor device shown at a subsequent step of the exemplary method of forming the npn bipolar transistor in accordance with the invention.
Figure 3H:
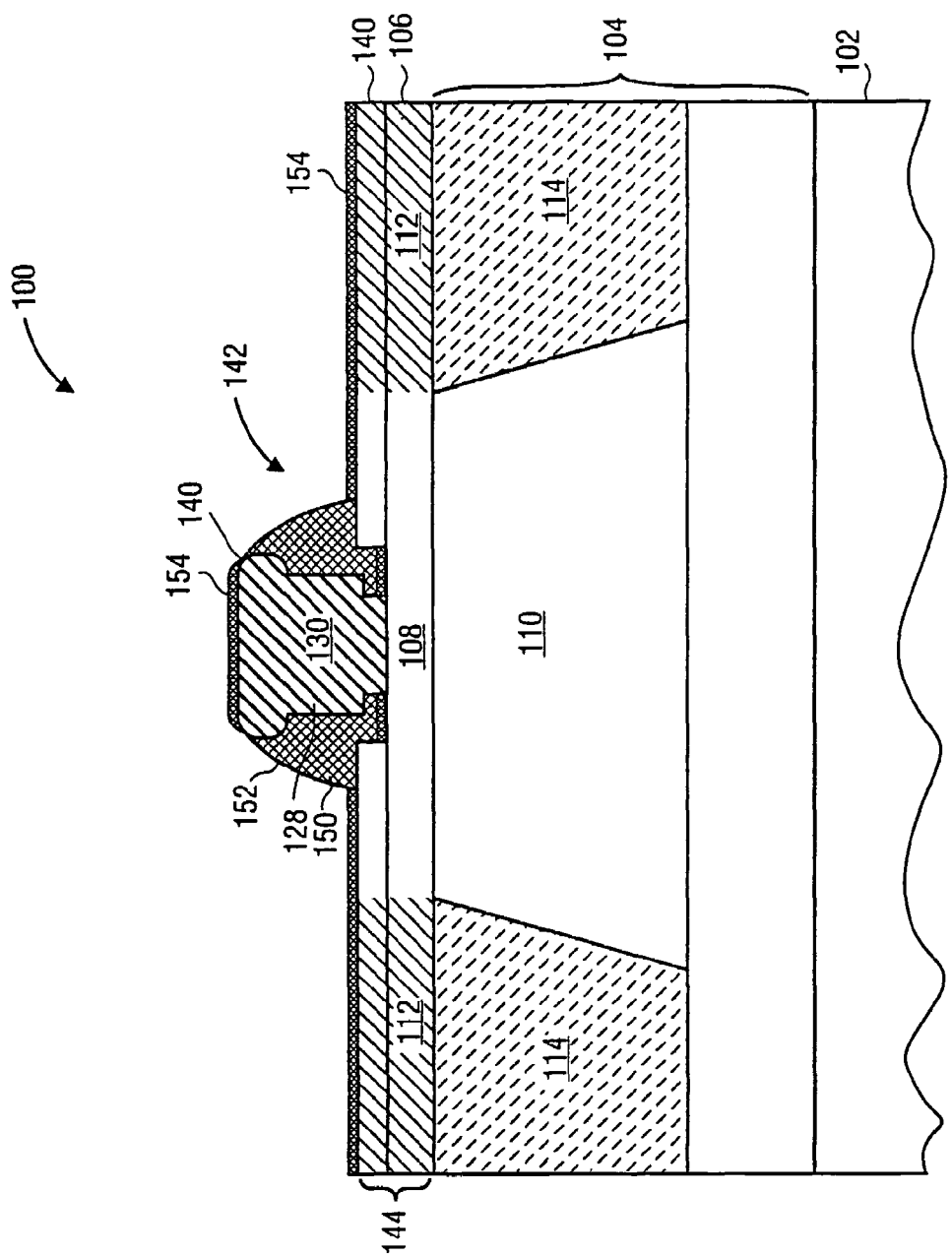
FIG. 3H illustrates a cross-sectional view of the exemplary semiconductor device shown as a subsequent step of the exemplary method of forming the npn bipolar transistor in accordance with the invention.

FIG. 3G illustrates a cross-sectional view of the exemplary semiconductor device 100 at another subsequent step of the exemplary method of forming a bipolar transistor in accordance with the invention. In this subsequent step, the thickness of the thin nitride spacer 132 is increased to a thickness on the order of about 0.1 microns to increase the width of the emitter region 142 in order to prevent the emitter silicide layer from shorting with the base silicide layer and in order to prevent the emitter contact etch exposing the base region 144. The thickness of the thin nitride spacer 132 is increased to form the nitride spacer 150 by forming a conformal silicon nitride layer 152 on the substrate 102 and selectively etching back the silicon nitride layer 152. In the exemplary method, the silicon nitride layer 152 is etched back by a reactive ion etch FIG. 3H illustrates a cross-sectional view of the exemplary semiconductor device 100 at another subsequent step of the exemplary method of forming a bipolar transistor in accordance with the invention. In this subsequent step, a silicide layer 154 is formed at the surface of the raised extrinsic base region 144 and the top surface of the emitter region 142.

Figure 3I:
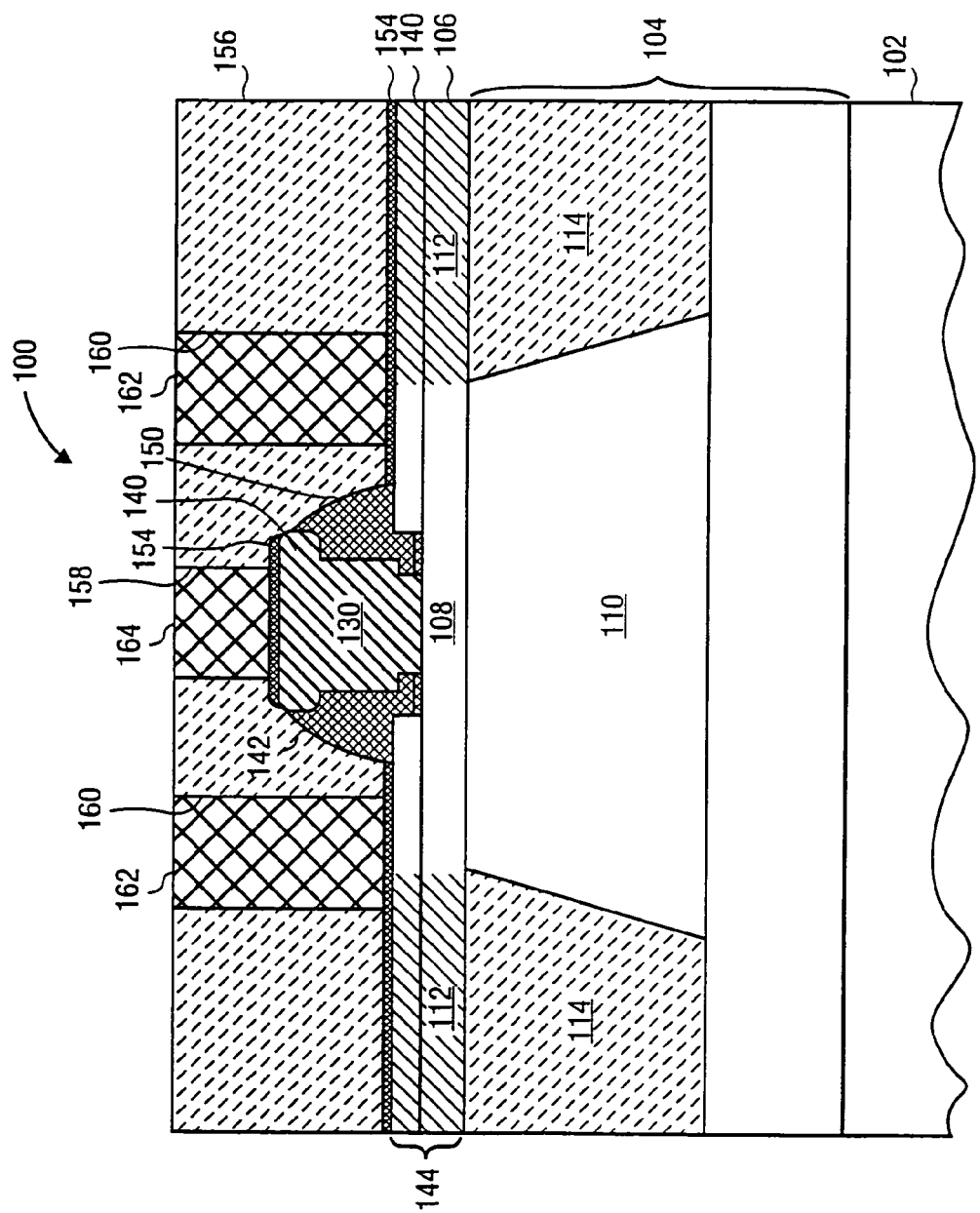
FIG. 3I illustrates a cross-sectional view of the exemplary semiconductor device shown as a subsequent step of the exemplary method of forming the npn bipolar transistor in accordance with the invention.

FIG. 3I illustrates a cross-sectional view of the exemplary semiconductor device 100 at another subsequent step of the exemplary method of forming a bipolar transistor in accordance with the invention. The surface of the substrate 102 is coated with an interlayer insulating film 156 such as silicon dioxide and planarized. An emitter contact window 158, base contact window 160, and collector contact window (not shown) are patterned and etched through the interlayer insulating film 156, and base contacts 162, an emitter contact 164, and collector contact (not shown) are formed.

In the foregoing specification, the invention has been described with reference to specific embodiments thereof. It will, however, be evident that various modifications and changes may be made thereto departing from the broader spirit and scope of the invention. For example, the raised base approach can be adapted to work in various schemes utilizing the sacrificial emitter feature. The specification and drawings are, accordingly, to be regarded in an illustrative rather than a restrictive case.

What is claimed is:

1. A bipolar transistor, comprising:
  a substrate to provide a collector region;
  a base region having an intrinsic base region and an extrinsic base region, the extrinsic base region includes a first epitaxial layer and a second epitaxial layer on the first epitaxial layer, each of the intrinsic base region and the extrinsic base region having a mono-crystalline portion over a mono-crystalline portion of the substrate, the extrinsic base region further has a poly-crystalline portion over an oxide portion of the substrate; and
  an emitter structure over the intrinsic base region;
  wherein the extrinsic base region is raised relative to the intrinsic base region;
  wherein the extrinsic base region has a thickness x and the intrinsic base region has a thickness y, and wherein x is greater than y.

2. The bipolar transistor of claim 1, wherein
  the emitter structure includes
    a polysilicon emitter having a first portion with a width a, a second portion with a width b, and a third portion with a width c;
    wherein c is greater than b which is greater than a; and
    wherein the first portion defines an emitter base junction, and wherein the third portion defines an emitter contact region.

3. The bipolar transistor of claim 2, wherein
  the emitter structure further includes a nitride spacer directly adjacent to the polysilicon emitter.

4. The bipolar transistor of claim 1, wherein
  the first epitaxial layer is a SiGe epitaxial layer and
  the second epitaxial layer is a heavily p-type doped Si or SiGe epitaxial layer.

5. The bipolar transistor of claim 1, wherein
  the bipolar transistor is an npn transistor.

6. A bipolar transistor, comprising:
  a substrate having a collector region, the collector region being a collector terminal;
  a first epitaxial silicon layer having a mono-crystalline portion on a mono-crystalline portion of the substrate and a poly-crystalline portion on an oxide portion of the substrate;
  an emitter stack on the first epitaxial silicon layer, the emitter stack being an emitter terminal;

a second epitaxial silicon layer having a mono-crystalline portion on the mono-crystalline portion of the first epitaxial silicon layer located outside the emitter stack;

wherein a region of the first epitaxial silicon layer located under the emitter stack is an intrinsic base region and a region of the second epitaxial silicon layer on portions of the first epitaxial silicon layer located outside the emitter stack being a raised extrinsic base region;

wherein the raised extrinsic base region has a thickness greater than a thickness of the intrinsic base region; and wherein the intrinsic base region and the raised extrinsic base region provide a base terminal of the bipolar transistor with lower resistivity.

7. The bipolar transistor of claim 6, wherein
the first epitaxial layer is a p-type Si, SiGe or SiGe:C epitaxial layer and
the second epitaxial layer is a selectively deposited heavily p-type doped Si epitaxial layer or a selectively deposited heavily p-type doped SiGe epitaxial layer.

8. The bipolar transistor of claim 6, wherein
the emitter stack includes
a nitride layer having an emitter window, and
a polysilicon emitter within the emitter window.

9. The bipolar transistor of claim 6, wherein
the bipolar transistor is a Si, SiGe or SiGe:C npn bipolar transistor.

10. A bipolar transistor having a base, a collector, and an emitter, the bipolar transistor comprising:
a substrate with a collector region;
a base region coupled to the substrate, the base region having an intrinsic base region and an extrinsic base region, each of the intrinsic base region and the extrinsic base region the extrinsic base region includes a first epitaxial layer and a second epitaxial layer on the first epitaxial layer, having a mono-crystalline portion over a mono-crystalline portion of the substrate, the extrinsic base region further has a poly-crystalline portion over an oxide portion of the substrate;
a polysilicon emitter structure coupled to the intrinsic base region; and
wherein the extrinsic base region has a thickness X and the intrinsic base region has a thickness y, and wherein x is greater than Y.

11. The bipolar transistor of claim 10, wherein
the extrinsic base region is raised relative to the intrinsic base region.

12. The bipolar transistor of claim 10, wherein
the polysilicon emitter structure has a first portion providing an emitter base junction, a second portion providing conduction, and a third portion providing an emitter contact region.

13. The bipolar transistor of claim 12, wherein
the first portion of the polysilicon emitter structure has a width A,
the second portion of the polysilicon emitter structure has a width B differing from A,
the third portion of the polysilicon emitter structure has a width C differing from A and C.

14. The bipolar transistor of claim 13, wherein
the width C is greater than the width B which is greater than the width A.

15. The bipolar transistor of claim 1, further comprising:
a silicide layer on a top surface of the extrinsic base region to lower a contact resistance.

16. The bipolar transistor of claim 15, wherein
the silicide layer is a refractory metal silicide layer of $CoSi_2$ or $TiSi_2$.

17. The bipolar transistor of claim 6, wherein
the second epitaxial layer further has a has a poly-crystalline portion on the poly-crystalline portion of the first epitaxial layer.

18. The bipolar transistor of claim 6, further comprising:
a silicide layer on a top surface of the second epitaxial silicon layer to lower a contact resistance.

19. The bipolar transistor of claim 18, wherein
the silicide layer is a refractory metal silicide layer of $CoSi_2$ or $TiSi_2$.

20. The bipolar transistor of claim 10, further comprising:
a silicide layer on a top surface of the extrinsic base region to lower a contact resistance.

21. The bipolar transistor of claim 20, wherein
the silicide layer is a refractory metal silicide layer of $CoSi_2$ or $TiSi_2$.

22. A bipolar transistor, comprising:
a substrate having a mono-crystalline portion and an oxide portion, the substrate to provide a collector region;
a plurality of epitaxial layers over the substrate, each of the plurality of epitaxial layers having a mono-crystalline portion over the mono-crystalline portion of the substrate and a poly-crystalline portion over the oxide portion of the substrate; and
a polysilicon emitter on the mono-crystalline portion of a first epitaxial layer of the plurality of epitaxial layers;
wherein the plurality of epitaxial layers to provide a raised extrinsic base located outside the polysilicon emitter, the mono-crystalline portion of the first epitaxial layer under the polysilicon emitter to provide an intrinsic base, and the raised extrinsic base is thicker than the intrinsic base.

23. The bipolar transistor of claim 22, wherein
at least a second epitaxial layer of the plurality of epitaxial layers is coupled to the first epitaxial layer to provide the raised extrinsic base.

24. The bipolar transistor of claim 23, wherein
the first epitaxial layer is a SiGe epitaxial layer and
the at least second epitaxial layer is a heavily p-type doped Si or SiGe epitaxial layer.

25. The bipolar transistor of claim 22, further comprising:
a silicide layer on a top surface of the raised extrinsic base to lower a contact resistance.

26. The bipolar transistor of claim 25, wherein
the silicide layer is a refractory metal silicide layer of $CoSi_2$ or $TiSi_2$.

27. The bipolar transistor of claim 22, wherein the bipolar transistor is an npn transistor.

28. The bipolar transistor of claim 27, wherein
the npn transistor is a Si, SiGe or SiGe:C npn bipolar transistor.

* * * * *